United States Patent [19]
Lenz

[11] Patent Number: 6,019,060
[45] Date of Patent: Feb. 1, 2000

[54] CAM-BASED ARRANGEMENT FOR POSITIONING CONFINEMENT RINGS IN A PLASMA PROCESSING CHAMBER

[75] Inventor: Eric H. Lenz, San Jose, Calif.

[73] Assignee: Lam Research Corporation, Fremont, Calif.

[21] Appl. No.: 09/104,158

[22] Filed: Jun. 24, 1998

[51] Int. Cl.[7] .................................................. C30C 2/00
[52] U.S. Cl. ...................................... 118/723 R; 156/345
[58] Field of Search .......................... 156/345; 118/723 R

[56] References Cited

U.S. PATENT DOCUMENTS 5,534,751  7/1996  Lenz et al. ........................ 315/111.71

*Primary Examiner*—Bruce Breneman
*Assistant Examiner*—Rudy Zervignon
*Attorney, Agent, or Firm*—Beyer & Weaver, LLP

[57] ABSTRACT

A cam-based arrangement configured to move a confinement ring along a first axis of a plasma processing chamber. The confinement ring is disposed in a plane that is orthogonal to the first axis. The cam-based arrangement includes a cam ring having a plurality of cam regions formed on a first surface of the cam ring. There is further included a plurality of cam followers in rolling contact with the first surface of the cam ring. There is also included a plurality of plungers oriented parallel to the first axis, each of the plurality of plungers being coupled to one of the plurality of cam followers and to the confinement ring, wherein the plurality of plungers move in an orchestrated manner parallel to the first axis as the cam ring is rotated and the plurality of cam followers stay in the rolling contact with the first surface of the cam ring.

21 Claims, 4 Drawing Sheets

CAM-BASED ARRANGEMENT FOR POSITIONING CONFINEMENT RINGS IN A PLASMA PROCESSING CHAMBER

BACKGROUND OF THE INVENTION

The present invention relates to the fabrication of semiconductor-based devices. More particularly, the present invention relates to improved techniques for controlling the movement of confinement rings in plasma processing chambers.

In the fabrication of semiconductor-based devices (e.g., integrated circuits or flat panel displays) layers of material may alternately be deposited onto and etched from a substrate surface (e.g., the semiconductor wafer or the glass panel). As is well known in the art, the etching of the deposited layer(s) may be accomplished by a variety of techniques, including plasma-enhanced etching. In plasma-enhanced etching, the actual etching of the substrate takes place inside a plasma processing chamber. During etching, a plasma is formed from a suitable etchant source gas to etch areas of the substrate that are unprotected by the mask, leaving behind the desired pattern.

Among different types of plasma etching systems, those utilizing confinement rings have proven to be highly suitable for efficient production and/or for forming the ever shrinking features on the substrate. An example of such a system may be found in commonly assigned U.S. Pat. No. 5,534,751, which is incorporated by reference herein. Although the use of confinement rings results in a significant improvement in the performance of plasma processing systems, current implementations can be improved. In particular, it is realized that improvements can be made in the way in which the confinement rings are raised and lowered to facilitate substrate transport.

To facilitate discussion, FIG. 1 depicts an exemplary plasma processing chamber 100, including confinement rings 102 as they are currently implemented. Although only two confinement rings are shown in the example of FIG. 1, it should be understood that any number of confinement rings may be provided. Within plasma processing chamber 100, there is shown a chuck 104, representing the workpiece holder on which a substrate 106 is positioned during etching. Chuck 104 may be implemented by any suitable chucking technique, e.g., electrostatic, mechanical, clamping, vacuum, or the like, and is surrounded by an insulator 108. During etching, RF power supply 110 may source RF power having a frequency of, for example, about 2 MHz to about 27 MHz, to chuck 104.

Above substrate 106, there is disposed a reactor top 112, which is formed of a conductive material such as aluminum and is coupled to confinement rings 102. Also coupled to reactor top 112 are a upper electrode 114 and a baffle 116. Upper electrode 114 is electrically insulated from grounded chamber wall 118 by insulator 150 and is powered by an RF power supply 120 to facilitate the formation of a plasma out of etchant source gases supplied via a gas line 122 and baffle 116. RF power supply 120 may have any suitable frequency, e.g., about 2 MHz in one exemplary system. If the two electrodes 104 and 114 are supplied with RF power having different frequencies, an optional return coil 160, a return capacitor 162, and insulator 164 may be provided as shown. However, if the same frequency is employed (e.g., if both electrodes are powered by the same power supply), optional return coil 160, return capacitor 162, and insulator 166 may be omitted. As can be readily appreciated by those skilled in the art, the plasma processing chamber of FIG. 1 represents a capacitively coupled plasma processing chamber although the confinement ring concept also works well with other types of processing chambers (such as inductively coupled plasma processing chambers, for example).

To load and unload substrate 106 from plasma processing chamber 100, confinement rings 102 need to be raised and lowered during substrate transport. Since confinement rings 102 are coupled to reactor top 112 and its associated hardware, the movement of confinement rings 102 of FIG. 1 is accomplished by raising or lowering the entire reactor top. In the plasma processing chamber of FIG. 1, raising and lowering the reactor top is accomplished by an arrangement that includes ball screws, a chain drive, and a motor. With reference to FIG. 1, there are provided ball screws 130, of which there are typically three or four per reactor top. Ball screws 130 are coupled to a motor 202 via chains 204 (shown more clearly in FIG. 2). As motor 202 rotates, ball screws 130 rotate in unison to raise or lower the reactor top (and the attached confinement rings).

It is realized, however, that improvements can be made to the existing arrangement. By way of example, it is realized that raising the entire reactor top requires a lot of energy since there is a significant pressure differential between the ambient pressure and the near-vacuum environment within plasma processing chamber 100. Since the reactor top has a large cross-section, a lot of energy is required to overcome the force (as high as 1,500 pounds in one example) exerted on the reactor top by the ambient pressure.

Furthermore, one or more large seals are typically required between the reactor top and the chamber walls to maintain the near-vacuum environment within plasma processing chamber 100. With reference to FIG. 1, for example, these seals are shown as seals 154. Since each seal encircles the entire circumference of the reactor top, there is a large seal area present to the corrosive plasma etch environment. As is well known to those skilled in the art, seals and the lubricants employed therewith break down over time, contributing to unwanted contaminants in the etch environment. For this reason, a large seal area is generally undesirable.

Still further, seals 154 electrically insulate reactor top 112 from grounded chamber wall 118. To provide an RF return path, one or more flexible conductors 152 are typically required between reactor top 112 and grounded chamber wall 118. The use of this flexible conductor increases the maintenance requirement of plasma processing chamber 100 since flexible conductor 152 may fatigue and break over time. Such maintenance concern also exists with regard to flexible gas line 122, which also may fatigue and break or leak over time.

In view of the foregoing, there are desired improved techniques for raising and lowering the confinement rings in a plasma processing chamber.

SUMMARY OF THE INVENTION

The invention relates, in one embodiment, to a cam-based arrangement configured to move a confinement ring along a first axis of a plasma processing chamber. The confinement ring is disposed in a plane that is orthogonal to the first axis. The cam-based arrangement includes a cam ring having a plurality of cam regions formed on a first surface of the cam ring. There is further included a plurality of cam followers in rolling contact with the first surface of the cam ring. There is also included a plurality of plungers oriented parallel to the first axis, each of the plurality of plungers being coupled to one of the plurality of cam followers and to the confinement ring, wherein the plurality of plungers move in an orchestrated manner parallel to the first axis as the cam ring is rotated and the plurality of cam followers stay in the rolling contact with the first surface of the cam ring.

In another embodiment, the invention relates to a method for controlling pressure at a surface of a substrate during plasma processing in a plasma processing chamber. The method includes providing a confinement ring that encircles a plasma region formed above the substrate during the plasma processing, at least a portion of the confinement ring being disposed in an exhaust path of the plasma processing chamber. If a first pressure at the surface of the substrate is above a predefined pressure, the method includes moving the confinement ring in a first direction to increase a pressure drop across the confinement ring, thereby decreasing the first pressure at the surface of the substrate. If the first pressure at the surface of the substrate is below the predefined pressure, the method includes moving the confinement ring in a second direction opposite the first direction to increase the first pressure.

In another embodiment, the invention relates to a cam-based arrangement configured to move a confinement ring along a first axis of a plasma processing chamber. The confinement ring is disposed within the plasma processing chamber and in a plane that is orthogonal to the first axis. The cam-based arrangement includes a cam ring disposed outside of the plasma processing chamber and having a cam region formed on a first surface of the cam ring. There is included a cam follower disposed outside of the plasma processing chamber and in rolling contact with the first surface of the cam ring. There is further included a plunger oriented in parallel to the first axis, the plunger being coupled to the confinement ring and the cam follower. The plunger is disposed orthogonal to the plane, wherein the plunger is configured to move in a direction that is parallel to the first axis to cause the confinement ring to be moved along the first axis while remaining substantially parallel to the plane.

These and other advantages of the present invention will become apparent upon reading the following detailed descriptions and studying the various drawings.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion of the features and advantages of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to avoid unnecessarily obscuring the present invention.

In accordance with one aspect of the present invention, there is provided a cam-based arrangement for raising and lowering the confinement rings within the plasma processing chamber. The cam-based arrangement utilizes cam followers and a cam ring to raise and lower plungers, which are connected to at least one of the confinement rings. As the cam ring rotates, the plungers are raised or lowered in an orchestrated manner to raise or lower the confinement rings. Because only the plungers need to be moved against the pressure differential between the ambient pressure and the near-vacuum environment within the plasma processing chamber, significantly less energy is required to accomplish the movement of the confinement rings. Because the entire reactor top does not need to be raised and lowered to move the confinement rings, the cam-based arrangement advantageously permits the reactor top to be attached to the chamber walls in a fixed manner. As such, there is no need to employ flexible (but high maintenance) conductors to couple the reactor top to the chamber walls. Also, there is not need to employ flexible and high maintenance gas lines to provide the etchant source gases to the plasma processing chamber interior.

In accordance with another aspect of the present invention, the cam regions of the cam ring may be profiled to achieve fine control of confinement ring movement in order to fine tune the pressure drop across the confinement ring area. By moving only the confinement rings to control the pressure drop across the confinement ring area (which affects the pressure at the substrate surface), the pressure at the substrate surface may be controlled without significantly affecting other etch parameters.

In accordance with yet another aspect of the invention, the use of plungers to facilitate the raising and lowering of the confinement rings (instead of raising and lowering the entire reactor top to accomplish the same) advantageously reduces the seal area exposed to the corrosive plasma etch environment. Although seals are still employed around the plungers, these seals are smaller and therefore contribute less to the particulate contamination problem within the plasma processing chamber.

Figure 3:
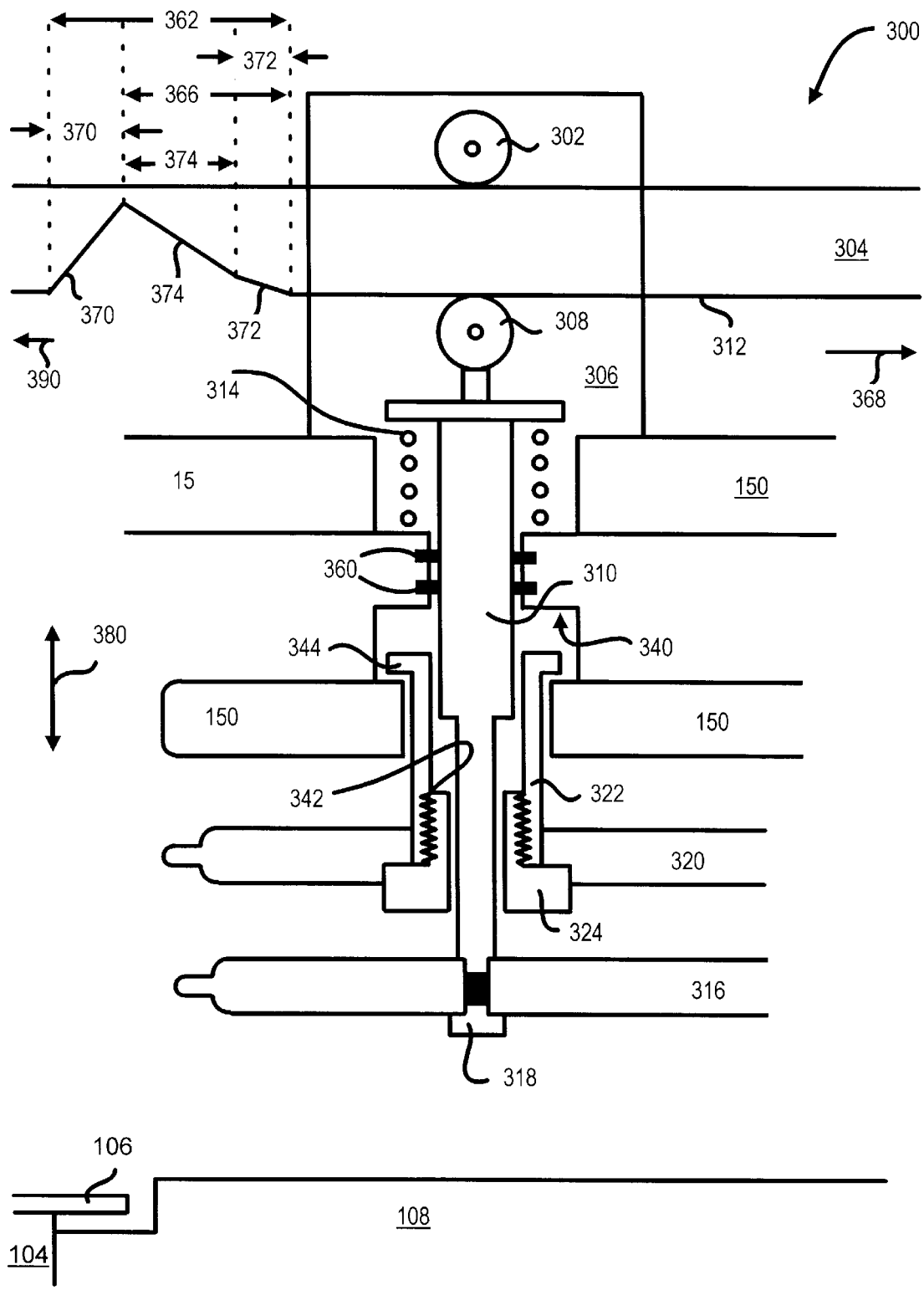
FIG. 3 illustrates, in accordance with one embodiment of the present invention, the inventive cam-based arrangement for raising and lowering the confinement rings.

To facilitate discussion of the features and advantages of the present invention, FIG. 3 illustrates, in accordance with one embodiment of the present invention, a plunger arrangement 300 of the cam-based arrangement. Plunger arrangement 300 includes a wheel 302, which is shown to be in rolling contact with a cam ring 304. Wheel 302 is adjustably mounted on a backing plate 306 (via, for example, a boltand-slot arrangement). Backing plate 306 itself may be mounted on the reactor top and is essentially immobile with respect to the reactor top.

A cam follower 308 is mounted on a plunger 310. Plunger 310 and the attached cam follower 308 are urged toward a lower surface 312 of cam ring 304 by spring 314. Cam follower 308 stays in rolling contact with lower surface 312 to permit plunger 310 to rise or fall with the contours in lower surface 312. Plunger 310 is coupled with lower confinement ring 316 via fastener 318, which takes the form of a plastic bolt in the implementation of FIG. 3. As can be seen, plunger 310 moves upward and downward parallel to axis 380, which is orthogonal to the plane defined by the confinement ring.

In the example of FIG. 3, an upper confinement ring 320 is permitted to float freely relative to plunger 310. A bushing 322 is coupled to upper confinement ring 320 using a fastener 324, which takes the form of a hollow bolt in the implementation of FIG. 3. However, other methods of attaching upper confinement ring 320 to bushing 322 may also be employed. A passageway is formed through both bushing 322 and fastener 324 to permit plunger 310 to be raised and lowered therethrough.

As plunger 310 and attached lower confinement ring 316 are raised, lower confinement ring 316 at some point impacts the head of fastener 324 on its way upward. The head of fastener 324 is spaced apart from the lower surface of upper confinement ring 320 by a small distance (e.g., 0.005 inch) to advantageously keep the lower confinement ring and the upper confinement ring from coming into direct contact, thereby minimizing the flaking of any accumulated particulate matters which may be collected at the surfaces of these confinement rings. Of course it is possible to provide other spacing mechanisms, e.g., protrusions on the lower surface of the upper confinement ring and/or the upper surface of the lower confinement ring, to accomplish the same purpose.

If plunger 310 is permitted to continue to move upward, it will reach an upper limit when the upper surface of bushing 332 (shown as flange 344) comes into contact with a stop 340 built into reactor top 112. This preferably occurs before the upper surface of upper confinement ring 320 comes into contact with the lower surface of insulator 150, which contact may cause particulate matters collected on the confinement ring surfaces to flake off.

In the downward path of plunger 310, upper confinement ring 320 is urged downward by gravity or if stuck then by shoulder 342 built into plunger 310, which impacts fastener 324 when plunger 310 moves downward. The downward movement of upper confinement ring 320 is constrained by a flange 344 that is built into bushing 322. As flange 344 comes into contact with the upper surface of insulator 150, the downward movement of upper confinement ring 320 is arrested.

Lower confinement ring 316, which is attached to plunger 310 by fastener 318 simply moves downward as plunger 310 moves downward. The downward movement of plunger 310 is constrained when shoulder 342 of plunger 310 comes into contact with fastener 324 as bushing 322 is fully lowered (which causes flange 344 to rest on the upper surface of insulator 150). Of course since spring 314 always urge plunger 310 and cam follower 308 toward lower surface 312 of cam ring 304, the resting position of lower confinement ring 316 is determined by the position of plunger 310, which is defined by the contour in lower surface 312 of cam ring 304.

A pair of seals 360 mounted in grooves formed in reactor top 112 permit the low pressure within the plasma processing chamber to be maintained as plunger 310 moves up and down following the contour in lower surface 312 of cam ring 304. Although two seals are shown, any number of seals may be employed as desired.

As mentioned earlier, the up and down movement of plunger 310 is controlled by the contour in lower surface 312 of cam ring 304. As shown in FIG. 3, lower surface 312 includes a cam region 362, of which there is preferably one for every plunger assembly. Cam region 362 preferably includes an inclining surface 366, which causes plunger 310 to be moved upward as cam ring 304 is rotated in the direction of arrow 368, and a declining surface 370, which causes plunger 310 to be moved downward as cam ring 304 is rotated in the direction of arrow 390. In one embodiment, declining surface 370 is not employed for controlling plunger 310. Instead, plunger 310 is moved upward and downward employing only inclining surface 366 as the cam ring is rotated back and forth and cam follower 308 follows the contour of inclining surface 366.

Inclining surface 366 preferably, but not necessarily, includes two separate regions having two different slopes. As can be seen in FIG. 3, a slope 374 of inclining surface 366 is steeper than a slope 372 to allow plunger 310 to move upward and downward a greater distance per degree of rotation of cam ring 304. Slope 374 may be used for coarse control, e.g., during wafer transport, and slope 372 may be employed for fine control of the position of the confinement rings, e.g., during pressure control. Pressure control is an aspect of the invention that will be discussed later herein.

Figure 4:
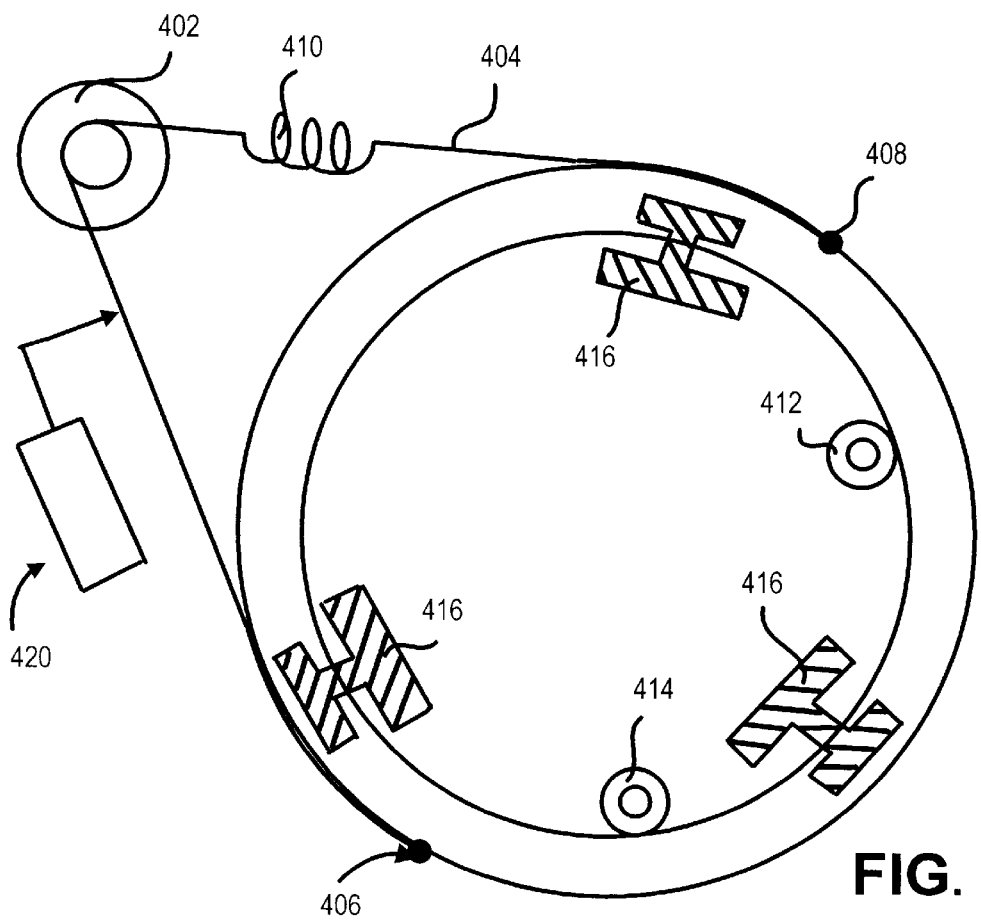
FIG. 4 is an overhead view of the inventive cam-based arrangement of FIG. 3.

FIG. 4 shows a simplified diagram of the cam-based arrangement in accordance with one embodiment of the present invention, including a motor 402 that is employed to rotate cam ring 304. Motor 402 is coupled to cam ring 304 via a belt 404. Belt 404 is attached to cam ring 304 at points 406 and 408 although it may be permitted to wrap around cam ring 304 if desired. A tensioning arrangement 410 takes up the slack in belt 404 and pulls cam ring 304 toward motor 402 to urge the inner surface of cam ring 404 to be in rolling contact with rollers 412 and 414 (of which two are necessary to define the center of rotation of the cam ring although any additional number of rollers may be provided).

Three plunger assemblies 416 are shown disposed about cam ring 304. However, any number of plunger assemblies may be employed with cam ring 304. As can be appreciated by those skilled in the art, the plungers in assemblies 416 move in an orchestrated manner as their attached cam followers ride on the lower surface of cam ring 304, and as cam ring 304 is rotated clockwise and counterclockwise by motor 402 (via belt 404). Also shown in FIG. 4 is an optional positional feedback arrangement 420, which is implemented in the form of a linear potentiometer coupled to belt 404. However, any other type of positional sensor arrangement may be employed to provide data pertaining to the rotation of cam ring 304. From the feedback data and the known profiles of the cam regions in cam ring 304, the position of plungers 310 and the confinement rings in the plasma processing chamber may be derived.

As can be appreciated from the foregoing, the inventive cam-based arrangement for raising and lowering the confinement rings advantageously reduces the seal area exposed to the etching plasma. In contrast to the situation in FIG. 1, there are no seals encircling the entire reactor top. Instead, only one or more small seals are provided for each plunger, which significantly reduces the seal area exposed to the corrosive plasma environment and the concomitant potential for seal-related particulate contamination.

Furthermore, since the reactor top does not need to be moved to lower and raise the confinement rings, flexible conductors for the RF path and flexible lines for the input etchant source gases are no longer required. By eliminating the flexing of these components, it is expected that less maintenance will be required. Also, since the entire reactor top does not need to be moved to raise or lower the confinement rings, substantially less energy is required to reposition the confinement rings. Due to their small cross-sectional areas, the plungers can be moved against the pressure differential (between the ambient pressure and the near vacuum condition within the plasma processing chamber) with only a small amount of force (e.g., only about 1/300th of the force required to move the entire reactor top in one implementation), thereby reducing the need for heavy duty motors and heavy chain drive arrangements as well as improving safety.

In accordance with another aspect of the present invention, the ability of the cam-based arrangement to raise or lower the confinement rings without affecting the chamber volume (which would be affected if the entire reactor top is moved) advantageously gives rise to the possibility of using the confinement rings to achieve pressure control during etching. It is reasoned by the inventor herein that although the etch pressure (i.e., the pressure at the substrate's surface during etching) can be changed by many mechanisms (e.g., changing the input rate of the etchant source gas), the response would be improved if pressure control can be accomplished locally (i.e., in the vicinity of the substrate).

Figure 5:
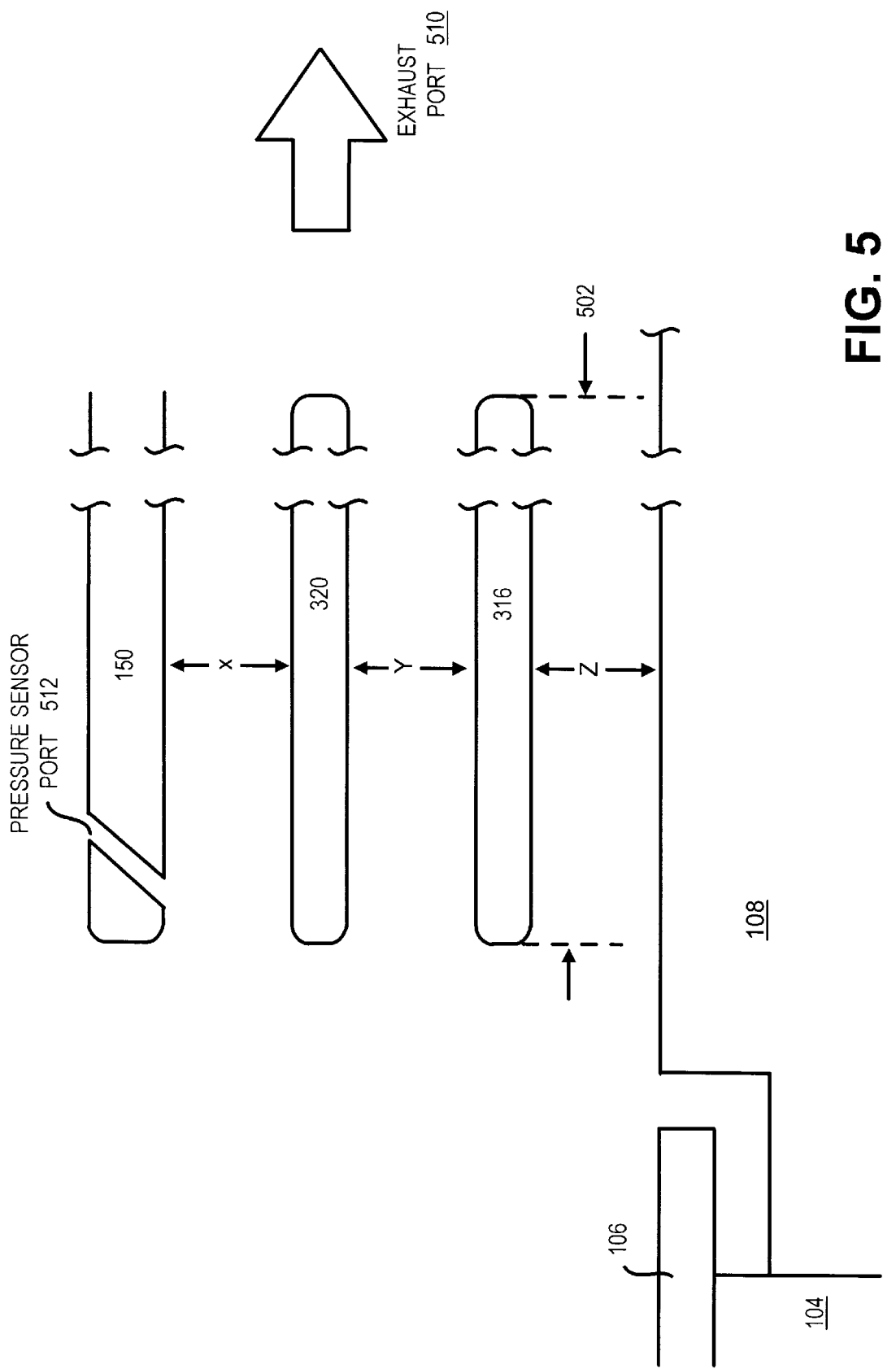
FIG. 5 illustrates a plasma processing chamber having therein two confinement rings to facilitate discussion of the pressure control aspect of the present invention.

In FIG. 5, a plasma processing chamber having therein two confinement rings is shown to facilitate discussion of the pressure control aspect of the present invention. It should be noted, however, that the pressure control technique disclosed herein should work with any number of confinement rings. It is reasoned by the inventor that the pressure drop across the confinement rings (i.e., across dimension 502) is approximately proportional to the expression:

$$1/(x^2+y^2+z^2) \qquad \text{Eq. 1.}$$

In Eq. 1, x denotes the distance between upper confinement ring 320 and the ceiling of the exhaust path (which is defined by insulator 150 in the present example), y denotes the distance between upper confinement ring 320 and lower confinement ring 316, and z denotes the distance between lower confinement ring 316 and the floor of the exhaust path (which is defined by insulator 108 in the present example). It should be apparent to those skilled in the art that equation 1 can readily be modified to take into account additional confinement rings (e.g., by adding the square of the distance between a confinement ring to its neighbor into the denominator of the equation).

Accordingly, increasing the value of z (by raising the lower confinement ring 316 from insulator 108) has the effect of reducing the pressure drop across the confinement rings while decreasing the value of z (by lowering the lower confinement ring 316) has the effect of increasing the pressure drop across the confinement rings. Since the input flow rate of the etchant source gas and the rate at which the byproduct gases are exhausted from the chamber (via port 510 in FIG. 5) tend to be set at a constant value during etching, increasing or decreasing the pressure drop across the confinement rings leads to a decrease or an increase of the etch pressure at the surface of substrate 106.

FIG. 5 also shows a pressure sensor port 512 that is arranged to permit -a suitable pressure sensor to ascertain the pressure existing over substrate 106 in real time. The sensed pressure is employed as a feedback signal to ascertain whether the confinement ring should be raised or lowered to achieve the desired pressure at the substrate surface during plasma etching.

The use of the cam-based arrangement to change the position of the confinement rings relative to one another and to the walls of the exhaust path advantageously facilitates local control of the pressure at the substrate surface during plasma etching. The ability to locally control this etch pressure at the substrate surface helps ensure the repeatability of the etch process from substrate to substrate. As mentioned earlier, local control improves the response time. If the pressure at the substrate surface is changed by varying the volume of the input etchant source gas or by increasing the pump out rate of the byproduct gases instead, the response time would have been slower, and there may be other undesirable side effects as well.

Figure 1:
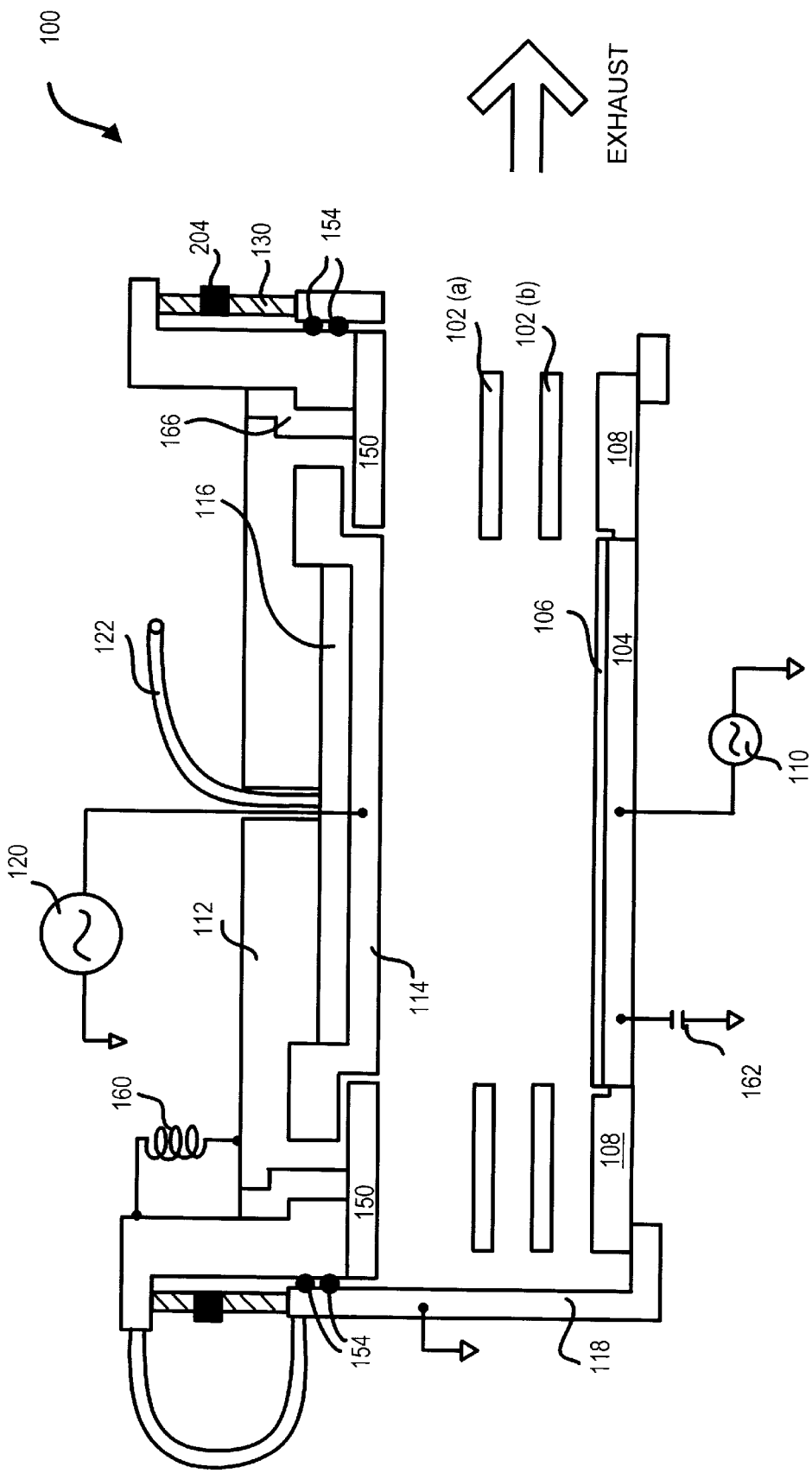
FIG. 1 depicts a cross-sectional view of an exemplary plasma processing chamber, including the confinement rings as they are currently implemented.
Figure 2:
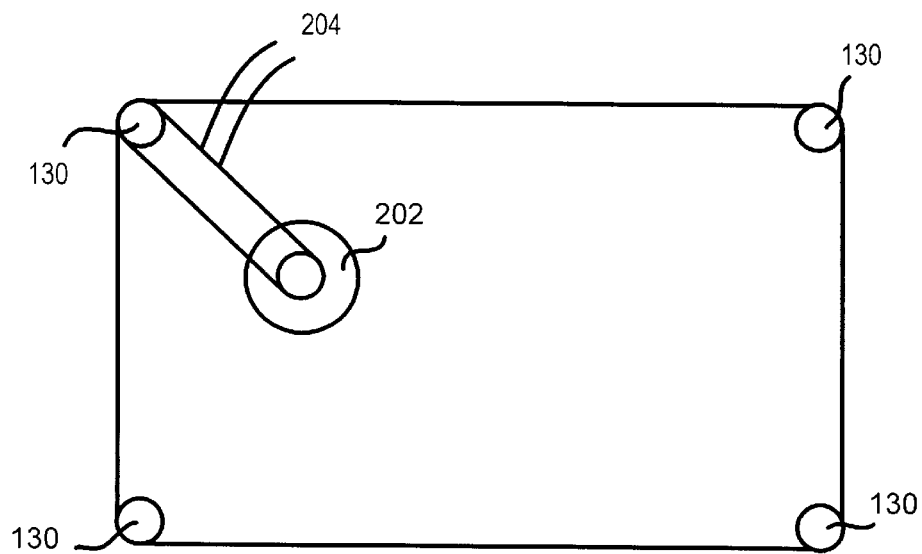
FIG. 2 is an overhead view of the exemplary plasma processing chamber of FIG. 1.

Unlike the situation of FIG. 1, note that the pressure control is advantageously achieved without changing the total volume of the etch chamber (which would have occurred if the reactor top was raised or lowered). As such, any undesirable side effect associated with changing the chamber volume is eliminated. Also, note that pressure control is advantageously achieved without changing the distance between the top electrode and the substrate surface (which would also have occurred if the reactor top was raised or lowered). As can be appreciated by those skilled in the art, increasing or decreasing the distance between the top electrode and the substrate surface impacts the residence time of the plasma ions, which fundamentally changes the etch process at the substrate surface. Such unintended side effect is also avoided by the inventive cam-based arrangement.

Since the entire cam ring may be moved up or down simply by moving the position of wheel 302 (see FIG. 3) relative to backing plate 306, the inventive cambased arrangement simplifies the process of adjusting the position of the confinement rings within the plasma processing chamber. Further, it is simple to change the rate at which the confinement rings may be raised or lowered in the cam-based arrangement disclosed herein. The confinement rings may be raised or lowered more quickly by increasing the rate at which the cam ring rotates and/or by changing the profile of the cam region. By way of example, a shallow slope and a slow rotational speed tend to permit finer control of the confinement ring movement. Conversely, a steeper slope and a faster rotational speed allow the confinement ring to be raised or lowered more rapidly. As mentioned previously, a given cam region may advantageously, but is not required to, include both a steep slope and a relatively shallower slope. The ability to finely control the confinement ring movement is advantageous during pressure control for example. The ability to quickly raise or lower the confinement rings is advantageous during substrate transport for example.

While this invention has been described in terms of several preferred embodiments, there are alterations, permutations, and equivalents which fall within the scope of this invention. By way of example, although the cam regions are shown disposed at the lower surface of the cam ring, it is also possible to provide cam regions on the upper surface of the cam ring. In this case, the cam follower would ride along the upper surface, and the plunger is urged downward by an appropriate tensioning (e.g., spring) arrangement. Also, different types of fastener, seal, bushing, and/or stop arrangements may be provided to appropriately couple the plunger to parts of the plasma processing chamber and/or constrain the movement of the plunger (or each confinement ring). As another example, although the drive mechanism is discussed in terms of a motor and a belt arrangement, other drive mechanism arrangements employing for example chains, gears, hydraulic, friction wheels, or the like may also be employed. As a further example, although the invention is discussed in the context of a capacitively coupled plasma processing chamber, the cam-based arrangement disclosed herein may also be implemented in any suitable plasma processing chamber (including inductively-coupled plasma processing chambers) that employs confinement rings. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A cam-based arrangement configured to move a confinement ring along a first axis of a plasma processing chamber, said confinement ring being disposed in a plane that is orthogonal to said first axis, comprising:

a cam ring having a plurality of cam regions formed on a first surface of said cam ring;

a plurality of cam followers in rolling contact with said first surface of said cam ring;

a plurality of plungers oriented parallel to said first axis, each of said plurality of plungers being coupled to one of said plurality of cam followers and to said confinement ring, wherein said plurality of plungers move in an orchestrated manner parallel to said first axis as said cam ring is rotated and said plurality of cam followers stay in said rolling contact with said first surface of said cam ring.

2. The cam-based arrangement of claim 1 wherein there are three cam regions in said plurality of cam regions.

3. The cam-based arrangement of claim 2 wherein each of said cam regions includes an inclining surface and a declining surface, said inclining surface includes a first inclining slope and a second inclining slope steeper than said first inclining slope.

4. The cam-based arrangement of claim 3 wherein said second inclining slope permits said confinement ring to move more rapidly along said first axis than permitted by said first inclining slope when said cam ring is rotated.

5. The cam-based arrangement of claim 1 wherein said first surface is an upper surface of said cam ring.

6. The cam-based arrangement of claim 1 wherein said first surface is a lower surface of said cam ring.

7. A method for controlling pressure at a surface of a substrate during plasma processing in a plasma processing chamber, comprising:

providing a confinement ring, said confinement ring encircling a plasma region formed above said substrate during said plasma processing, at least a portion of said confinement ring being disposed in an exhaust path of said plasma processing chamber;

if a first pressure at said surface of said substrate is above a predefined pressure, moving said confinement ring in a first direction to decrease a pressure drop across said confinement ring, thereby decreasing said first pressure at said surface of said substrate; and if said first pressure at said surface of said substrate is below said predefined pressure, moving said confinement ring in a second direction opposite said first direction to increase said first pressure.

8. The method of claim 7 wherein said first pressure is ascertained by a pressure sensor disposed proximate said surface of said substrate.

9. The method of claim 7 wherein said plasma processing chamber includes another confinement ring, said confinement ring being moved without moving said another confinement ring in said plasma processing chamber.

10. The method of claim 7 further comprising:

providing a cam-based arrangement coupled to said confinement ring, said cam-based arrangement being configured to move said confinement ring in said first direction and said second direction while keeping a volume of said plasma processing chamber substantially constant.

11. The method of claim 10 wherein said providing said cam-based arrangement includes providing a cam ring, a plunger, and a cam follower, said plunger being coupled to said confinement ring and said cam follower, said cam follower being in rolling contact with a surface of said cam ring.

12. The method of claim 11 wherein said moving said confinement ring in said first direction involves rotating said cam ring in a first rotational direction.

13. The method of claim 12 wherein said moving said confinement ring in said second direction involves rotating said cam ring in a second rotational direction opposite said first rotational direction.

14. A cam-based arrangement configured to move a confinement ring along a first axis of a plasma processing chamber, said confinement ring being disposed within said plasma processing chamber and in a plane that is orthogonal to said first axis, comprising:

a cam ring disposed outside of said plasma processing chamber and having a cam region formed on a first surface of said cam ring;

a cam follower disposed outside of said plasma processing chamber and in rolling contact with said first surface of said cam ring;

a plunger oriented in parallel to said first axis, said plunger being coupled to said confinement ring and said cam follower, said plunger being orthogonal to said plane, wherein said plunger is configured to move in a direction that is parallel to said first axis to cause said confinement ring to be moved along said first axis while remaining substantially parallel to said plane.

15. The cam-based arrangement of claim 14 wherein said cam region includes an inclining surface and a declining surface, one of said inclining surface and said declining surface includes a first inclining slope and a second inclining slope steeper than said first inclining slope.

16. The cam-based arrangement of claim 15 wherein said second inclining slope causes said confinement ring to move more rapidly along said first axis than caused by said first inclining slope when said cam ring is rotated.

17. The cam-based arrangement of claim 14 further comprising a seal surrounding a circumference of said plunger.

18. The cam-based arrangement of claim 14 further including a tensioning arrangement configured to urge said cam follower toward said first surface of said cam ring.

19. The cam-based arrangement of claim 14 further including a wheel, said wheel being configured to be in rolling contact with a second surface of said cam ring, said second surface being opposite said first surface.

20. The cam-based arrangement of claim 14 further comprising a pair of rollers in rolling contact with said cam ring.

21. The cam-based arrangement of claim 20 further comprising a drive mechanism, said drive mechanism rotating said cam ring while urging said cam ring in a direction that is constrained by said pair of rollers.

* * * * *